(12) United States Patent
Snider et al.

(10) Patent No.: US 6,898,098 B2
(45) Date of Patent: May 24, 2005

(54) MOLECULAR-JUNCTION-NANOWIRE-CROSSBAR-BASED ASSOCIATIVE ARRAY

(75) Inventors: Greg Snider, Mountain View, CA (US); Philip J Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 293 days.

(21) Appl. No.: 10/356,027

(22) Filed: Jan. 31, 2003

(65) Prior Publication Data

US 2004/0151012 A1 Aug. 5, 2004

(51) Int. Cl.$^7$ .............................................. G11C 15/00
(52) U.S. Cl. ........................ 365/49; 365/151; 365/175; 365/177; 977/DIG. 1
(58) Field of Search .................... 365/49, 151, 175, 365/177; 977/DIG. 1

(56) References Cited

U.S. PATENT DOCUMENTS 6,256,767 B1 * 7/2001 Kuekes et al. .................. 716/9
2003/0200521 A1 * 10/2003 DeHon et al. ................ 716/16

* cited by examiner

*Primary Examiner*—Hoai Ho

(57) ABSTRACT

A method for configuring an associative array within a molecular-junction-nanowire crossbar, and nanoscale associative arrays configured by the method Keys are encoded as field-effect transistors selectively configured within the molecular-junction-nanowire crossbar, and values associated with keys are encoded as diodes selectively configured at molecular-junction-nanowire-crossbar junctions. Keys input into key registers result in a current signal indicating whether or not the key is stored within the associative array as part of a key/value pair and, if stored in the associative array, the value associated with the input key is output.

18 Claims, 17 Drawing Sheets

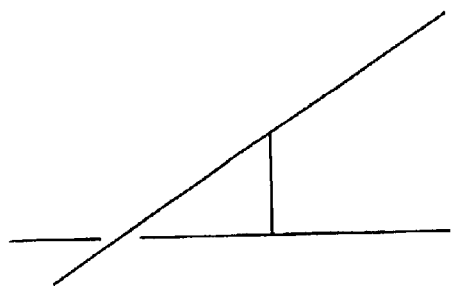
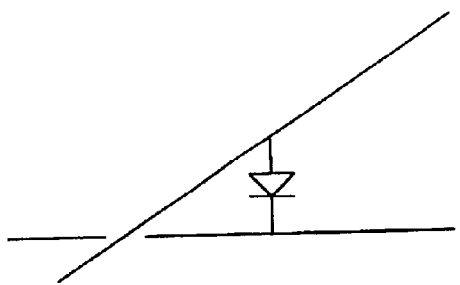
Figure 7A              Figure 7B
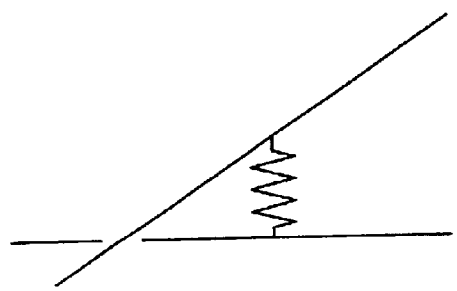
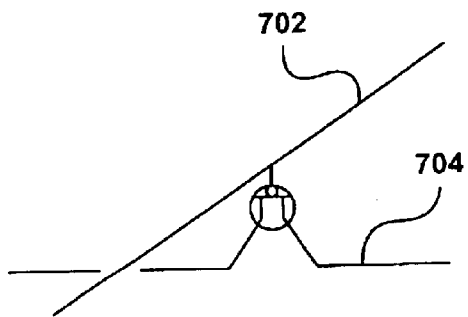
Figure 7C              Figure 7D
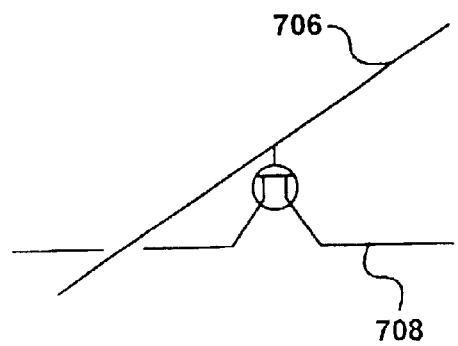
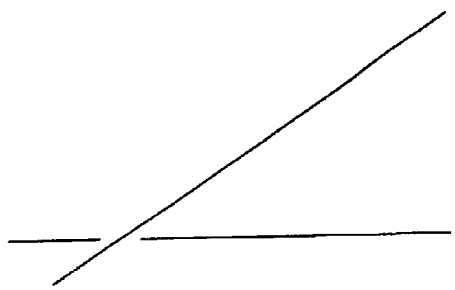
Figure 7E              Figure 7F

MOLECULAR-JUNCTION-NANOWIRE-CROSSBAR-BASED ASSOCIATIVE ARRAY

TECHNICAL FIELD

The present invention relates to associative arrays and, in particular, to programmanble, nanoscale-sized associative arrays configured from molecular-junction-nanowire crossbars that may be integrated with additional components in extremely dense electrical subsystems.

BACKGROUND OF THE INVENTION

During the past fifty years, the electronics and computing industries have been relentlessly propelled forward by the ever decreasing sizes of basic electronic components, such as transistors and signal lines, and by the correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding and expensive higher-energy-radiation-based technologies need to be employed to create smaller components using photolithographic techniques. Not only must expensive semiconductor fabrication facilities be rebuilt in order to use the new techniques, many new obstacles are expected to be encountered. For example, it is necessary to construct semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor services decrease, resulting in an increasing proportion of defective devices during manufacture, and a correspondingly lower yield of useful product. Ultimately, various quantum effects that arise only at molecular-scale distances may altogether overwhelm current approaches to component construction in semiconductors.

In view of these problems, researchers and developers have expended considerable research effort in fabricating microscale and nanoscale electronic devices using alternative technologies, where nanoscale electronic devices generally employ nanoscale signal lines having widths, and nanoscale components having dimensions, of less than 100 nanometers. More densely fabricated nanoscale electronic devices may employ nanoscale signal lines having widths, and nanoscale components having dimensions, of less than 50 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits. Even were such straightforwardly miniaturized circuits able to feasibly manufactured, the much higher component densities that ensue from combining together nanoscale components necessitate much different strategies related to removing waste heat produced by the circuits In addition, the electronic properties of substances may change dramatically at nanoscale dimensions, so that different types of approaches and substances may need to be employed for fabricating even relatively simple, well-known circuits and subsystems at nanoscale dimensions. Thus, new implementation strategies and techniques need to be employed to develop and manufacture useful circuits and structures at nanoscale dimensions using nanowires.

One type of circuit that would be desirable to produce at nanoscale dimensions is an associative array. Associative arrays find widespread use in computers and other electronic devices. An associative array may be implemented either in software or hardware, and hardware-implemented associative arrays are particularly useful for implementing complex logic circuitry requiring retrieval of values paired with keys, including routers and complex computer systems. FIG. 1 shows an exemplary hardware-implemented associative array. The associative array 102 internally stores a table 104 of key/value pairs. The keys may be of arbitrary size, and the corresponding values may also be of arbitrary size. Each key/value pair is stored in a row, such as row 106, of the key/value-pair table 104. In FIG. 1, the successive rows of the table are assigned monotonically increasing addresses, from 0 to 7. The associative array 102 receives, in FIG. 1, three pairs of key input lines 108, 110, and 112, each key-input-line pair comprising a key line and its complement. For example, key-line pair 108 includes the key line $k_1$ 113 and its complement $\bar{k}_1$ 113. Each key-input-line pair represents a single bit of a key. Thus, in the exemplary associative array shown in FIG. 1, keys comprise three bits, which specify a range of values between 0 and 7. Note, however, that the keys have no correspondence with key/value-pair-table row addresses. The associative array 102 in FIG. 1 outputs 9 output signal lines, including 8 value output signal lines 116–123 and a valid-bit output signal line 124.

FIGS. 2 and 3 illustrate operation of the associative array shown in FIG. 1. When a particular key, such as the key "$key_b$" 202, is input to the key input signal lines 108, 110, and 112, and when the key/value-pair table 104 contains the input key, then the value portion of the key/value pair with key equal to the input key is output to the value output signal lines 116–123 and an ON, or "1, " value is output to the valid-bit output signal line 124. In FIG. 2, key "$key_b$" is contained in the second row 204 of the key/value-pair table 104. Therefore, the associative array 102 outputs the value "$value_1$" in response to input of key "$key_b$." Thus, an associative array matches input keys to stored key/value pairs, and when a key/value pair is found within the associative array with a key equal to the input key, the value portion of the key/value pair is output, along with an indication that the input key was found in the associative array, encoded in output of an ON or "1" value to the valid-bit output signal line 124. As shown in FIG. 3, when an input key, such as the key "$key_x$" 302, is not found within the key/value-pair table 104, then the output value is undefined, and the lack of a match of the input key with stored keys is indicated by output of an OFF or "0" state to the valid-bit output signal line 124.

Associative arrays find frequent use in circuitry supporting operating systems, network routers, and other such electronic devices and computer systems. Designers, manufacturers, and users of these systems have recognized the need for ever-smaller associative memories compatible with the ever-decreasing electrical component sizes in modern electronic devices. For this reason, a need has been recognized for nanoscale associative memories.

Unfortunately, the current methods by which associative arrays are fabricated are not amenable to simple miniaturization using nanowire-based structures similar to those currently employed at larger dimensions. Instead, designers, manufacturers, and users of devices that include associative arrays have recognized the need for new methods for implementing associative arrays that are useable at nanoscale dimensions. Moreover, to facilitate reuse and flexibility of associative-array components, designers, manufacturers, and users of devices that include associative arrays have recognized the need for reprogrammable associative arrays that can be reconfigured for alternative uses or to enhance the devices in which they are included.

SUMMARY OF THE INVENTION

In one embodiment of the present invention, an associative array is configured within a molecular-junction-nanowire crossbar. Keys are encoded as field-effect transistors selectively configured within the molecular-junction-nanowire crossbar, and values associated with keys are encoded as diodes selectively configured at molecular-junction-nanowire-crossbar junctions. Keys input into key registers result in a current signal indicating whether or not the key is stored within the associative array as part of a key/value pair and, if stored in the associative array, the value associated with the input key is output.

Molecular-junction-nanowire crossbars are quite defect and fault tolerant, and can be configured using a variety of different topologies. Molecular-junction-nanowire crossbar implementations of circuits consume very little power, and have extremely high densities. These extremely dense circuits can then be combined into extremely dense subsystems that include many additional electrical components, implemented within a set of complementary/symmetry ("CS") lattices. Thus, rather than simply representing a miniaturization of existing associative array circuits, in isolation, the present invention provides for building associative arrays into complex subsystems having transistor densities equal to, or greater than, 1 billion transistors/cm$^2$ or, in other words, having 1.0 giga-transistor/cm$^2$ densities and greater transistor densities.

BRIEF DESCRIPTION OF THE DRAWINGS

FIG. 7A to 7F schematically illustrate a number of simple electrical components that can be programmed at the junctions of nanowires in molecular-junction-nanowire crossbars.

DETAILED DESCRIPTION OF THE INVENTION

As discussed below, molecular-junction-nanowire crossbars represent one of a number of emerging nanoscale-electronic circuit configuration media that can be used to construct nanoscale electronic circuits. The present invention provides a method for configuring associative arrays from molecular-junction-nanowire crossbars. The present invention provides methods for configuring more complex, familiar electronic circuits using selective configuration of simple electronic components within molecular-junction-nanowire crossbars. In a first subsection, below, molecular-junction-nanowire crossbars are described. In a second subsection, a number of embodiments of the present invention that employ molecular-junction-nanowire-crossbar technology are described.

Molecular-Junction-Nanowire Crossbars

Figure 1:
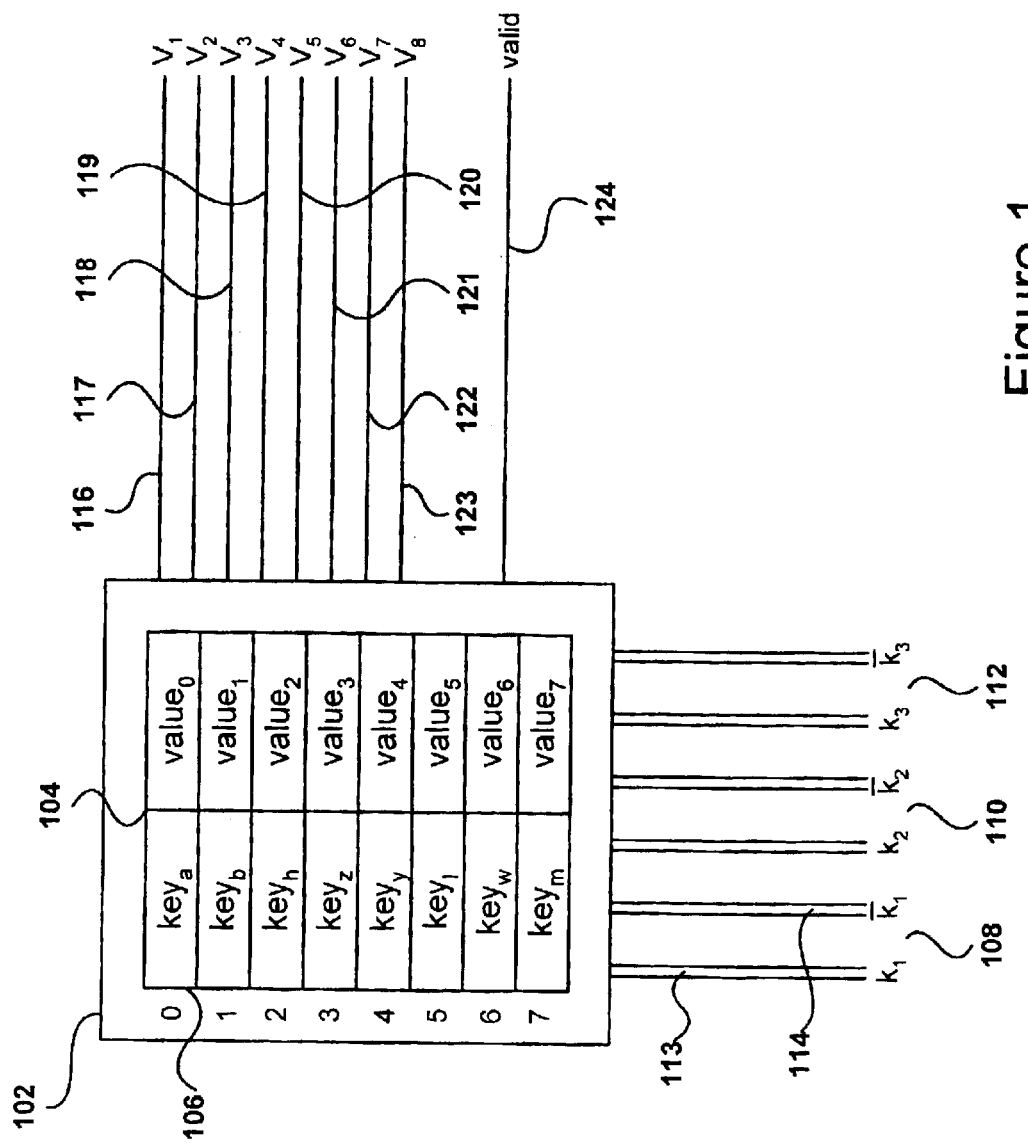
FIG. 1 shows an exemplary associative array.
Figure 2:
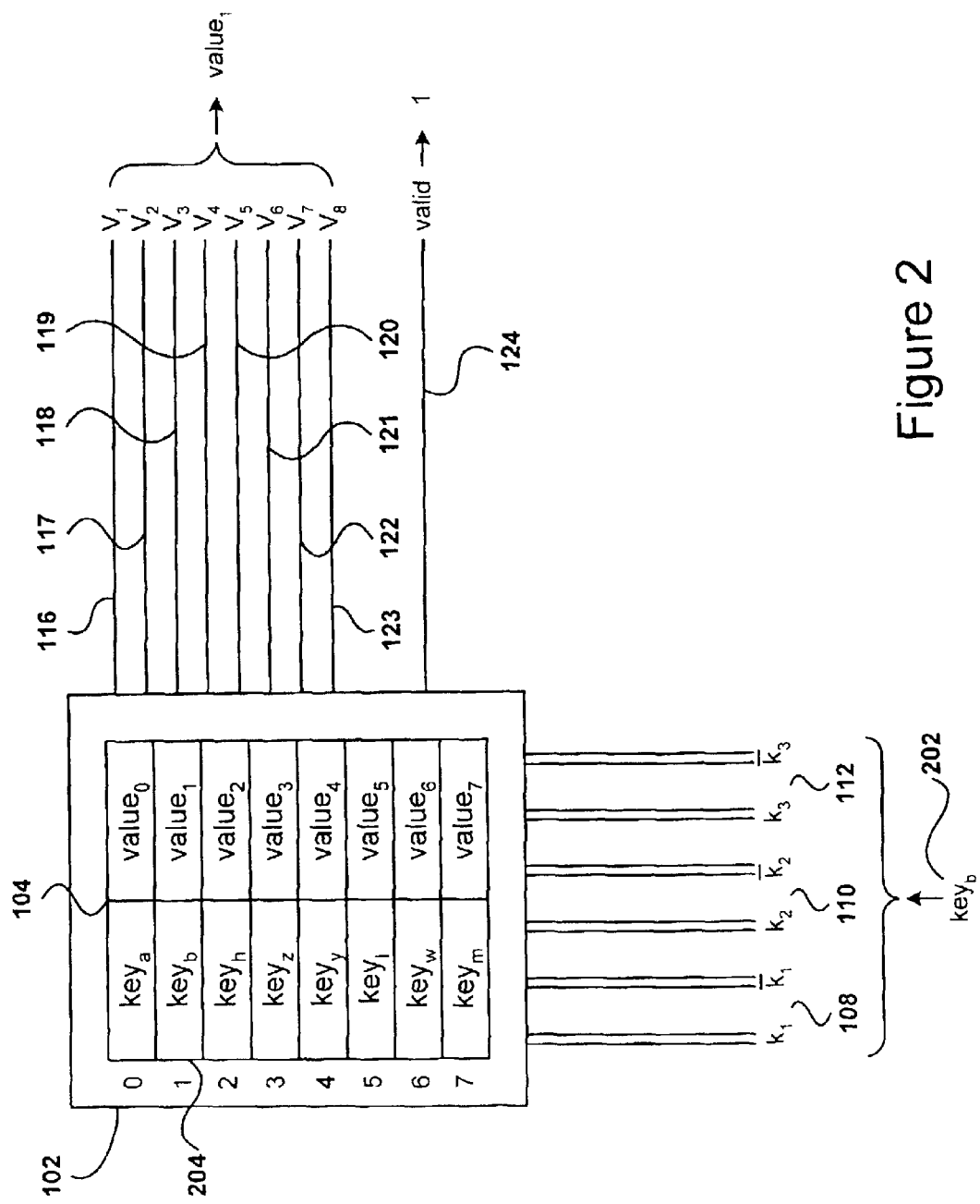
FIGS. 2 and 3 illustrate operation of the associative array shown in FIG. 1.
Figure 3:
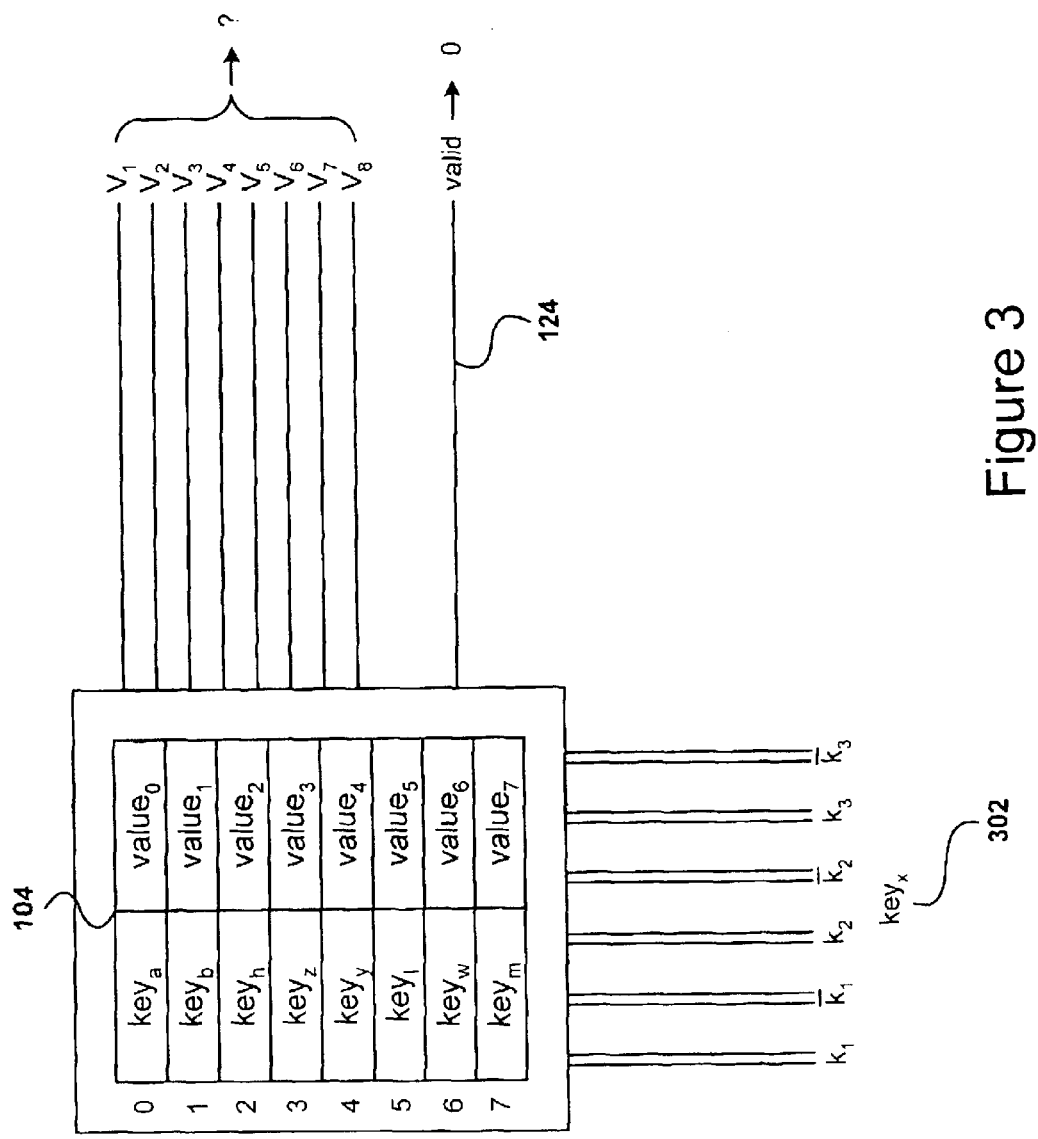
Figure 4:
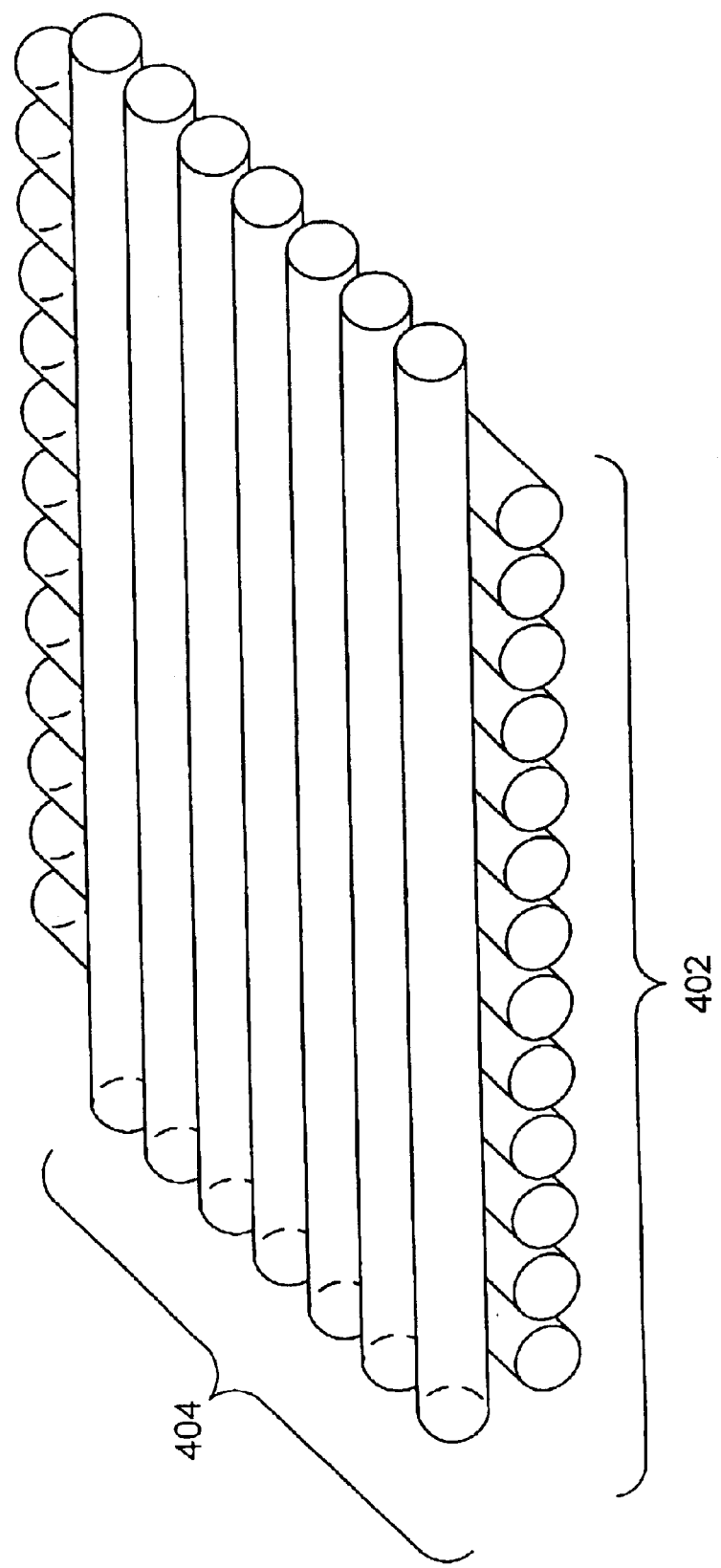
FIG. 4 illustrates a basic molecular-junction-nanowire crossbar.

A relatively new and promising alternative technology involves molecular-junction-nanowire crossbars. FIG. 2 illustrates a molecular-junction-nanowire crossbar. In FIG. 4, a first layer of approximately parallel nanowires 402 is overlain by a second layer of approximately parallel nanowires 404 roughly perpendicular, in orientation, to the nanowires of the first layer 402, although the orientation angle between the layers may vary. The two layers of nanowires form a lattice, or crossbar, each nanowire of the second layer 404 overlying all of the nanowires of the first layer 402 and coming into close contact with each nanowire of the first layer 402 at intersection points, or junctions that represent the closest contact between two nanowires.

Nanowires can be fabricated using mechanical nanoprinting techniques. Alternatively, nanowires can be chemically synthesized and can be deposited as layers of nanowires in one or a few process steps. Other alternative techniques for fabricating nanowires may also be employed. Thus, a two-dimensional molecular-junction-nanowire crossbar comprising first and second layers, as shown in FIG. 4, can be manufactured via a relatively straightforward process. Many different types of conductive and semi-conductive nanowires can be chemically synthesized from metallic and semiconductor substances, from combinations of these types of substances, and from other types of substances. A molecular-junction-nanowire crossbar may be connected to microscale signal-line leads or other electronic leads through a variety of different methods to incorporate the nanowires into electrical circuits.

Figure 5:
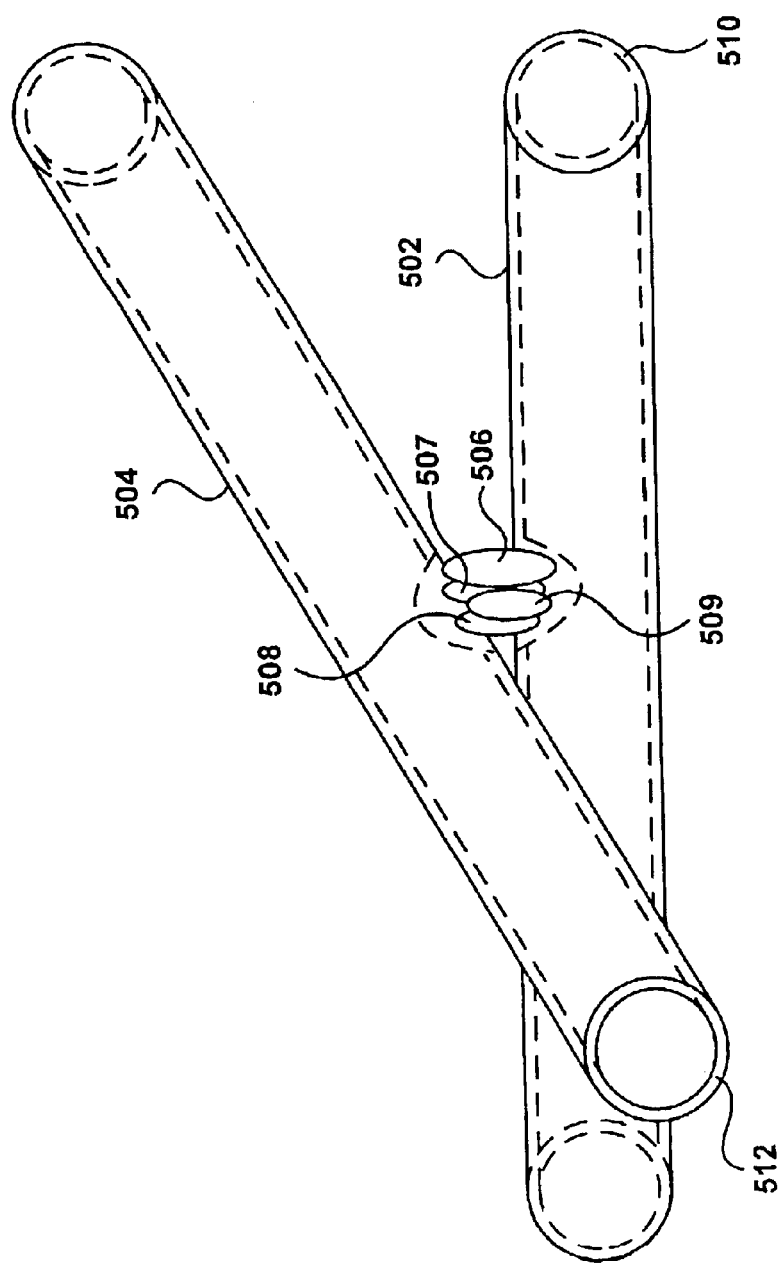
FIG. 5 illustrates a junction, or intersection, between two roughly orthogonal nanowires.
Figure 6A:
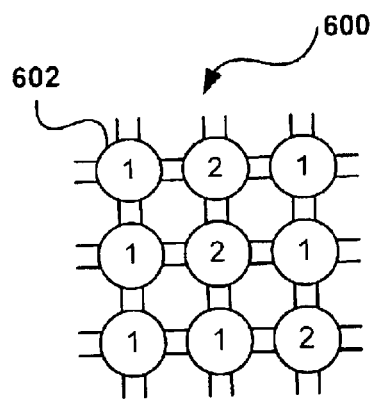
FIG. 6A to 6E illustrate one possible approach for configuring a network of nanoscale electrical components from a two-dimensional molecular-junction-nanowire crossbar.
Figure 6B:
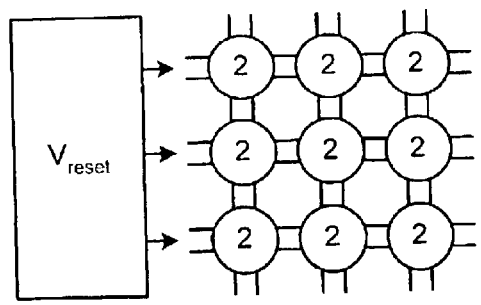
Figure 6C:
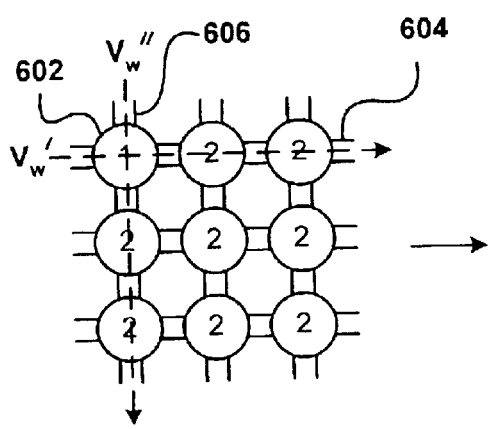
Figure 6D:
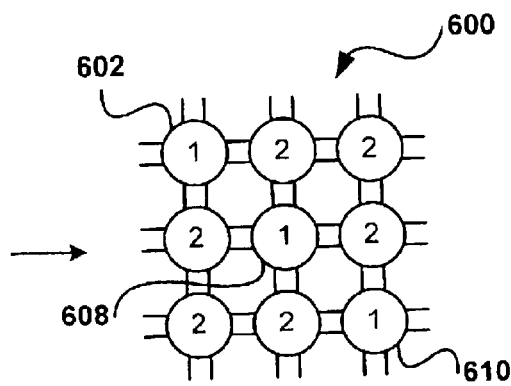
Figure 6E:
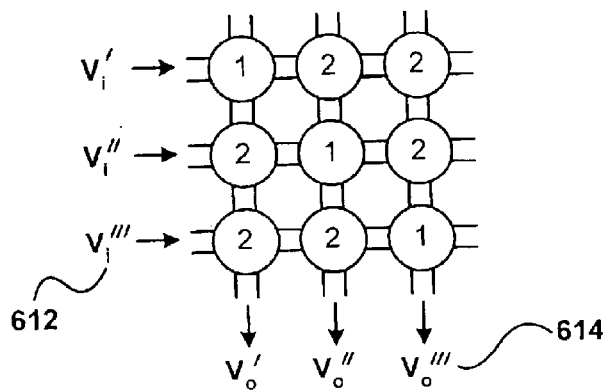

Molecular-junction-nanowire crossbars are not only layers of parallel conductive elements, but may also be used to create arrays of nanoscale electronic components, such as transistors, diodes, resistors, and other familiar basic electronic components. FIG. 5 illustrates a junction between nanowires of two contiguous layers within a molecular-junction-nanowire crossbar. In FIG. 5, the junction between a first nanowire 502 of a first nanowire layer intersects a second nanowire 504 of a second nanowire layer. Note that the junction may or may not involve physical contact between the two nanowires 502 and 504. As shown in FIG. 5, the two nanowires are not in physical contact at their closest point of approach, but the gap between them is spanned by a small number of molecules 506–509. Various different types of molecules may be introduced at junctions for a variety of different purposes. In many cases, the molecules of a junction may be accessed, for various purposes, through different voltage levels or current levels placed on the nanowires forming the junction. The molecules spanning the junction in FIG. 5 may have various different quantum states in which the molecules exhibit resistive, semiconductor-like, or conductive electrical properties. The current passing between the two nanowires intersecting at a junction may be a nonlinear function of the voltage across the junction as a result of quantum-mechanical tunneling of electrons through relatively low-energy, unoccupied quantum states of the molecules. The quantum states, and relative energies of quantum states, of the molecules may be controlled by applying differential currents or voltages to the nanowires forming the interaction. For example, molecules may be conductive in a reduced state, but may act as insulators in an oxidized state, with redox reactions controlled by voltage levels determining which of the quantum states the molecules inhabit.

In general, a molecular junction is anisotropic, having a polarity or direction with respect to physical properties, including electrical properties. This anisotropy may arise from different chemical and/or physical properties of nanowires in the two layers of a molecular-junction-nanowire crossbar, may arise from asymmetries of junction molecules combined with junction molecules being uniformly oriented with respect to the nanowire layers, and may arise both from differences in the properties of the nanowires as well as junction-molecule asymmetries. The fact the molecular junctions may have polarities allows for controlling junction properties by applying positive and negative voltages to molecular junctions, eliciting forward and reverse currents within the molecular junctions.

As shown in FIG. 5, the nanowires may include outer coatings, such as outer coatings 510 and 512. The outer coatings may serve to insulate nanowires from one another, may constitute the molecules that serve to span junctions when the nanowires are placed in contact with one another, or may serve as modulation-dopant-layers, which can be selectively activated to dope semiconductor nanowires. Both p-type and n-type modulation dopant coatings have been developed. In other applications, the molecules spanning junctions between crossing nanowires may be introduced as a separate layer formed between layers of nanowires. In some cases, the state changes of junction molecules may not be reversible. For example, the junction molecules may initially be resistive, and may be made conductive through application of relatively high voltages. In other cases, the junction molecules may be conductive, but the molecules may be irreversibly damaged, along with portions of the nanowires proximal to the junctions, through application of very high voltage levels, resulting in disrupting conductivity between the two nanowires and breaking electrical connection between them. In yet other cases, the junction molecules may transition reversibly from one state to another and back, so that the nanoscale electrical components configured at nanowire junctions may be reconfigured, or programmed, by application of differential voltages to selected nanowire junctions.

FIG. 6 illustrates one possible approach to configuring a network of reconfigurable nanoscale electrical components from a two-dimensional molecular-junction-nanowire crossbar. In FIGS. 6A–E, a small 3×3 molecular-junction-nanowire crossbar is shown, with circles at all nine junctions to indicate the state of the junction molecules. In one state, labeled "1" in FIGS. 6A–E, the junction molecules may have certain semiconductor, or conductive properties, while in a second state, labeled "2" in FIGS. 6A–E, junction molecules may have different properties. Initially, as shown in FIG. 6A, the states of the junctions of the molecular-junction-nanowire crossbar 600 are indeterminate. In other words, as shown in FIG. 6A, the states of the junctions, such as junction 602, are randomly distributed between state "1" and state "2." Next, as shown in FIG. 6B, a reset voltage "$v_{reset}$," often either a relatively large positive or negative voltage, is applied to all junctions in order to uniformly set the states of all junctions to a particular state, in the case shown in FIG. 6B, state "2." Next, as shown in FIG. 6C, each junction may be uniquely accessed by applying a write voltage, or configuring voltage, to the nanowires that form the junction in order to configure, or program, the junction to have the state "1." For example, in FIG. 6C, a first write voltage $v_w'$ is applied to horizontal nanowire 604 and a second write voltage $v_w''$ is applied to vertical nanowire 606 to change the state of the junction from "2" to "1." Individual junctions may be configured through steps similar to the steps shown in FIG. 6C to finally result in a fully configured nanoscale component network as shown in FIG. 6D. Note that, in FIG. 6D, the states of junctions 602, 608, and 610 that form a downward-slanted diagonal through the molecular-junction-nanowire crossbar have been configured by selective application of write voltages. Finally, as shown in FIG. 6E, the nanoscale electrical component network can be used as a portion of an integrated circuit. Input voltages $v_i'$, $v_i''$, and $v_i'''$ may be applied to the nanoscale electrical component lattice as inputs 612 and output voltages $v_o'$, $v_o''$, and $v_o'''$ 614 may be accessed as the result of operation of the nanoscale electrical component network that represents a portion of an integrated circuit. In general, the input and output voltages $v_i'$, $v_i''$, and $v_i'''$ and $v_o'$, $v_o''$, and $v_o'''$ have relatively low ma with the write voltages $v_w$ and the reset voltages $v_{reset}$. Should the integrated circuit need to be reconfigured, the reset voltage $v_{reset}$ may be again applied to the molecular-junction-nanowire crossbar, as in FIG. 6B, and the device reconfigured, or reprogrammed, as shown in steps in FIGS. 6C–D. Depending on the types of nanowires, types of dopants employed in the case of semiconductor nanowires, and the types of junction molecules employed in the molecular-junction-nanowire crossbar, many different, but similar configuring processes may be used to configure molecular-junction-nanowire crossbars into nanowire-based electrical components networks. The example of FIG. 6 is meant to illustrate a general process by which molecular-junction-nanowire crossbars may be configured as useful portions of electronic circuits.

Junctions of nanowires in molecular-junction-nanowire crossbars may be configured, in various techniques depending on the chemical nature of the nanowires and junction-spanning molecules, to form a wide variety of different, simple electronic devices. FIG. 7 schematically illustrates a number of simple electrical components that can be configured at the junctions of nanowires in molecular-junction-nanowire crossbars. A junction may represent (1) a simple conductive connection between the two nanowires, as shown in FIG. 7A; (2) a diode that conducts current in only one direction between the two nanowires, as shown in FIG. 7B; (3) a resistor, with the magnitude of resistance configurable by application of different configuring voltages, as shown in FIG. 7C; (4) a negatively doped field-effect transistor ("nFET"), as shown in FIG. 7D; (5) a positively doped field-effect transistor ("pFET"), as shown in FIG. 7E; and (6) the crossing of two conductive nanowires, with the voltage and current associated with each nanowire completely independent from one another, as shown in FIG. 7F. In the case of the nFET, shown in FIG. 7D, a relatively low voltage state on the gate wire 702 results in current passing through the source/drain wire 704, while a relatively high voltage on the gate wire 702 prevents conduction of current on the source/drain nanowire 704. The pFET of FIG. 7E exhibits opposite behavior, with high voltage on the gate wire 706 facilitating flow of current through the source/drain wire 708, and low voltage on the gate wire 706 preventing flow of current on the source/drain wire 708. Note also that a junction may also be configured as an insulator, essentially interrupting conduction at the junction with respect to both nanowires. Thus, as discussed above with reference to FIGS. 4–7, a two-dimensional molecular-junction-nanowire crossbar may be constructed and then configured as a network of electrical components. Note also that a junction, although shown in FIGS. 7A–F to comprise the junction of two single nanowires, may also comprise a number of junctions between a number of wires in a first layer of a molecular-junction-nanowire crossbar that together comprise a single conductive element and the nanowires in a second nanowire layer that together comprise a second conductive element.

The configurable electrical resistance of molecular junctions is an important and special property of molecular junctions. When certain types of molecules are used for molecular junctions, the initially relatively high resistance of the molecular junction may be lowered by applying a relatively large positive voltage to the molecular junction. The resistance of the molecular junction is generally a function of the magnitude of the highest voltage applied to the junction. By applying higher and higher positive voltages to a junction, the resistance of the junction can be made lower and lower. A relatively low resistance state achieved by application of a positive voltage may be reversed by applying a sufficiently high, negative voltage. Thus, not only is the electrical resistance of a molecular junction configurable, the electrical resistance may also be reconfigurable, depending on the type of molecules forming the molecular junction.

Figure 8:
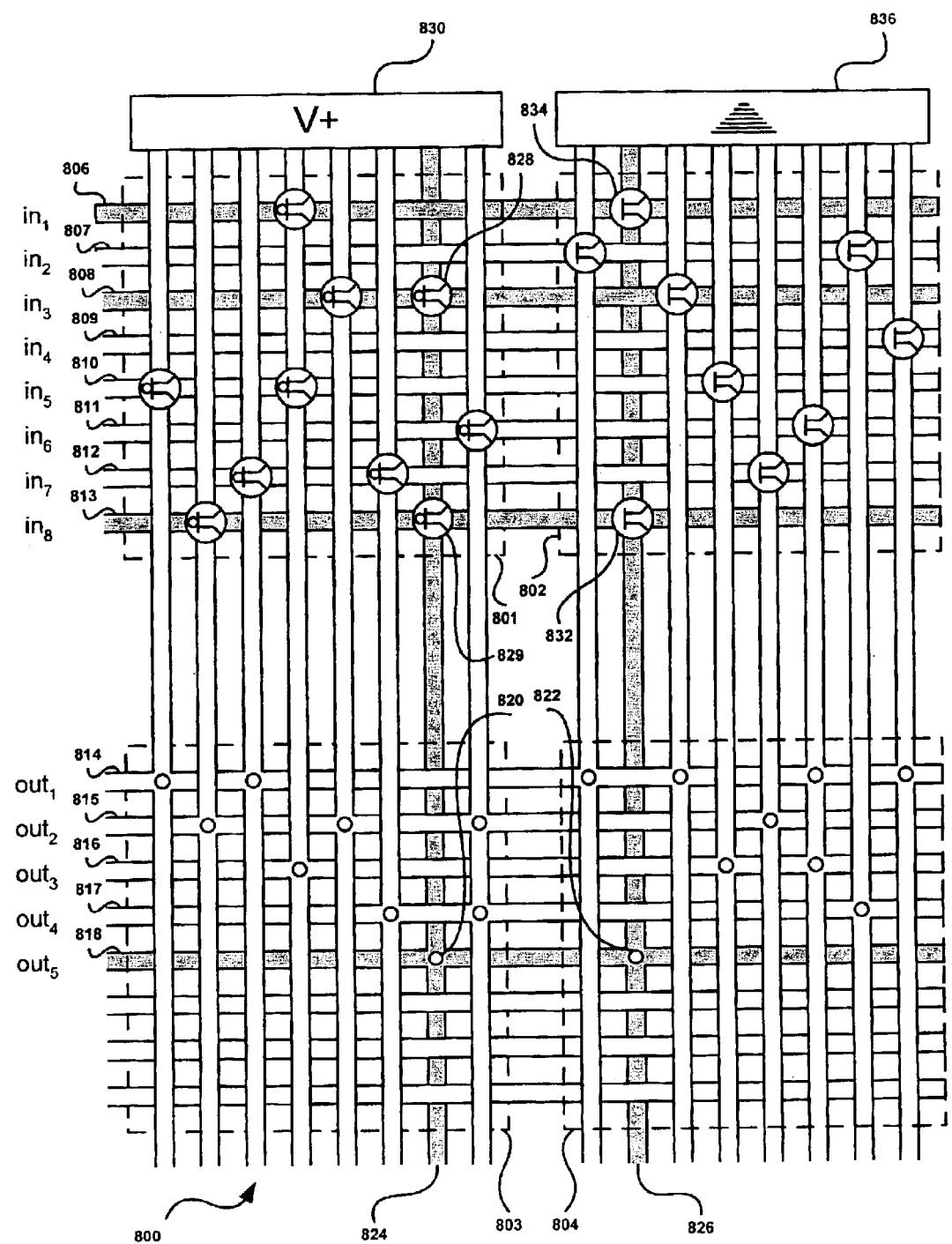
FIG. 8 illustrates an exemplary CS lattice.

A particularly useful type of nanoscale electronic component array based on molecular-junction-nanowire-crossbar technology is referred to as a "complementary/symmetry lattice" ("CS lattice"). FIG. 8 illustrates an exemplary CS lattice. Note that, although CS lattices are generally configured to represent logical and useful circuits, the CS lattice in FIG. 8 is rather arbitrarily configured, and is shown not as a representation of a particular subcircuit implemented by the CS lattice, and may not even be useful or functional, but rather is included to show the basic features of the CS lattice itself. In general, because of the small scales of the molecular-junction-nanowire-crossbar grids, it is difficult to chemically alter individual junctions. Techniques do exist for applying a very small number of molecules to a particular junction, but the techniques are painstakingly time consuming, and unsuitable for mass production. However, it is currently relatively straightforward to chemically alter subregions or microregions, comprising a number of junctions using currently available semiconductor manufacturing technologies. The term "microregion" is meant to indicate a scale larger than an individual molecular junction, but not necessarily a particular range of dimensions. It is current technically feasible to fabricate sub-mircon-sized microregions, for example. In the exemplary CS lattice shown in FIG. 8, four distinct, square microregions, demarcated by dashed lines 801-804, are shown within the molecular-junction-nanowire crossbar 800. Microregion 801 is chemically altered so that junctions within microregion 801 may be selectively configured as nFET components. Conversely, microregion 802 has been chemically altered so that junctions within subregion 802 may be selectively configured as pFET components. The microregions 803 and 804 have been chemically configured so that junctions within microregions 803 and 804 can be selectively configured as conductive links that electrically connect the nanowires forming the junctions. In certain embodiments, one set of parallel wires, the horizontal, conductive nanowires in FIG. 8, may be of nanoscale dimensions or of greater, sub-mircoscale or microscale dimensions, while the other set of parallel wires, the vertical semiconductive nanowires in FIG. 8, need to be of nanoscale dimensions in order for a CS-lattice-based circuit to properly function.

In a CS lattice, some number of nanowires is considered as a set of molecular input-signal lines. For example, in the CS lattice shown in FIG. 8, horizontal nanowires 806–813 are considered as inputs, and labeled "$in_1$"–"$in_8$." Similarly, a distinct set of wires is normally considered as a set of molecular output-signal lines. For example, in the CS lattice shown in FIG. 8, horizontal nanowires 814–818 are considered as molecular output-signal lines, and designated in FIG. 8 as "$out_1$"–"$out_5$." Consider, for example, molecular output-signal line, or horizontal nanowire, "$out_5$" 818. Proceeding along nanowire "$out_5$" 818 from left to right, it can be seen that molecular output-signal line "$out_5$" is connected via junction connections 820 and 822, denoted by small circles in the junctions, to vertical nanowires 824 and 826, respectively. Traversing these vertical nanowires 824 and 826, it can be seen that vertical wire 824 is connected with molecular input-signal line "$in_3$" 808 via an nFET 828 and connected with molecular input-signal line "$in_5$" 813 via an nFET 829. Thus, when molecular input-signal lines "$in_3$" 808 and "$in_5$" 813 are low, the nFETs 828 and 829 are activated to connect molecular output-signal line "$out_5$" with a high voltage source 830, potentially driving molecular output-signal line "$out_5$" to a high-voltage state. However, following vertical nanowire 826 upwards from the connection 822 to molecular output-signal line "$out_5$" 818, it can be seen that the vertical nanowire 826 interconnects with molecular input-signal line "$in_8$" 813 via a pFET 832 and interconnects with molecular input-signal line "$in_1$" 806 via pFET 834. Whenever molecular input-signal lines "$in_1$" and "$in_8$" are both in a high-voltage, or ON, state, then the pFETs 832 and 834 are activated to interconnect the vertical nanowire 826 with ground 836, essentially shorting vertical nanowire 826 and molecular output-signal line "$out_5$" 818 to ground. When molecular input-signal lines "$in_1$" and "$in_8$" are high, or ON, molecular output-signal line "$out_5$" 818 is low, or OFF. When both of molecular input-signal lines "$in_1$" and "$in_8$" are not high, or ON, and both molecular input-signal lines "$in_3$" and "$in_5$" are not low, or OFF, then molecular output-signal line "$out_5$" is undriven, and in a high impedance state. Thus, the state of molecular output-signal line "$out_5$" 818 depends only on the states of molecular input-signal lines "$in_1$," "$in_3$," and "$in_8$," and a truth table summarizing the response of molecular output-signal line to all possible input-signal-line-states can be provided as follows:

| $in_1$ | $in_3$ | $in_8$ | $out_5$ |
|---|---|---|---|
| 0 | 0 | 0 | 1 |
| 0 | 0 | 1 | high Z |
| 0 | 1 | 0 | high Z |
| 0 | 1 | 1 | high Z |
| 1 | 0 | 0 | 1 |
| 1 | 0 | 1 | 0 |
| 1 | 1 | 0 | high Z |
| 1 | 1 | 1 | 0 |

Various different types and sizes of CS lattices are possible. The configuration of CS lattices is constrained only by the fact that there is a minimum area of a molecular-junction-nanowire crossbar to which discrete types of chemically modifying agents can be applied, by direct deposit, by photolithographic methods, or by other methods. Thus, CS lattices comprise blocks of sublattices, or microregions, within which one or a small number of different types of nanoscale electrical components can be selectively created at nanowire junctions.

While a brief introduction to nanowire lattices has been provided, above, more detailed information is available in a number of patent applications and issued patents. Additional information may be obtained from: Kuekes, et al., U.S. Pat. No. 6,314,019B1; Kuekes, et al., U.S. Pat. No. 6,256,767B1; Kuekes, et al., U.S. Pat. No. 6,128,214; and Snider, et al., U.S. patent application Ser. No. 10/233,232.

Embodiments of the Present Invention

Figure 9:
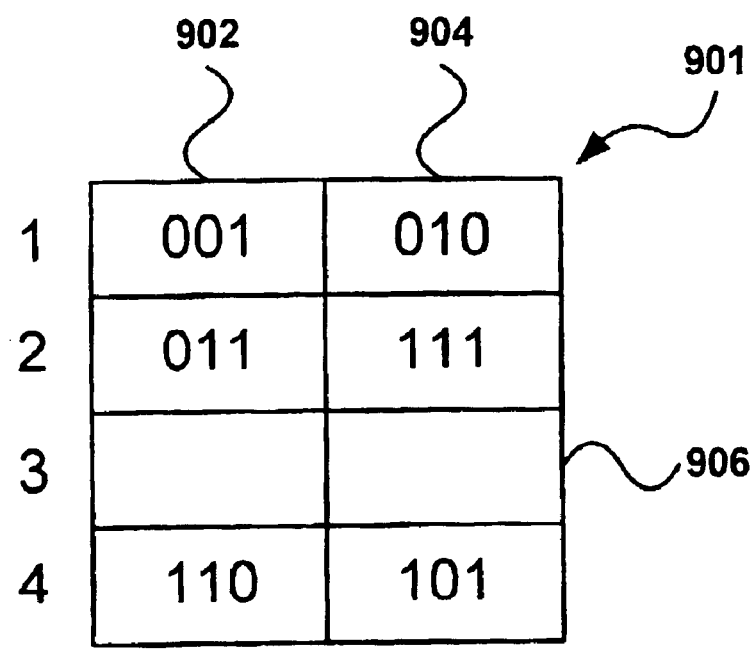
FIG. 9 illustrates a simple associative array implemented in a molecular-junction-nanowire crossbar as one embodiment of the present invention.

FIG. 9 illustrates a simple associative array implemented, below, in a molecular-junction-nanowire crossbar as one embodiment of the present invention. The simple associative array 901 includes four rows for key/value pairs, three of which are used. The keys, in column 902, are specified as three-bit quantities, and thus range in value from 0 to 7. The values associated with keys, shown in column 904, are also three-bit values. The third row of the associative array shown in FIG. 9 906, is empty, or, in other words, unused. Although this relatively small, exemplary associative array is used as the basis for the implementation, to be described below, it will be readily apparent that an associative array of any arbitrary size, with arbitrarily sized keys and arbitrarily sized values, can be implemented using the technique demonstrated in implementing the simple exemplary associative array shown in FIG. 9.

Figure 10:
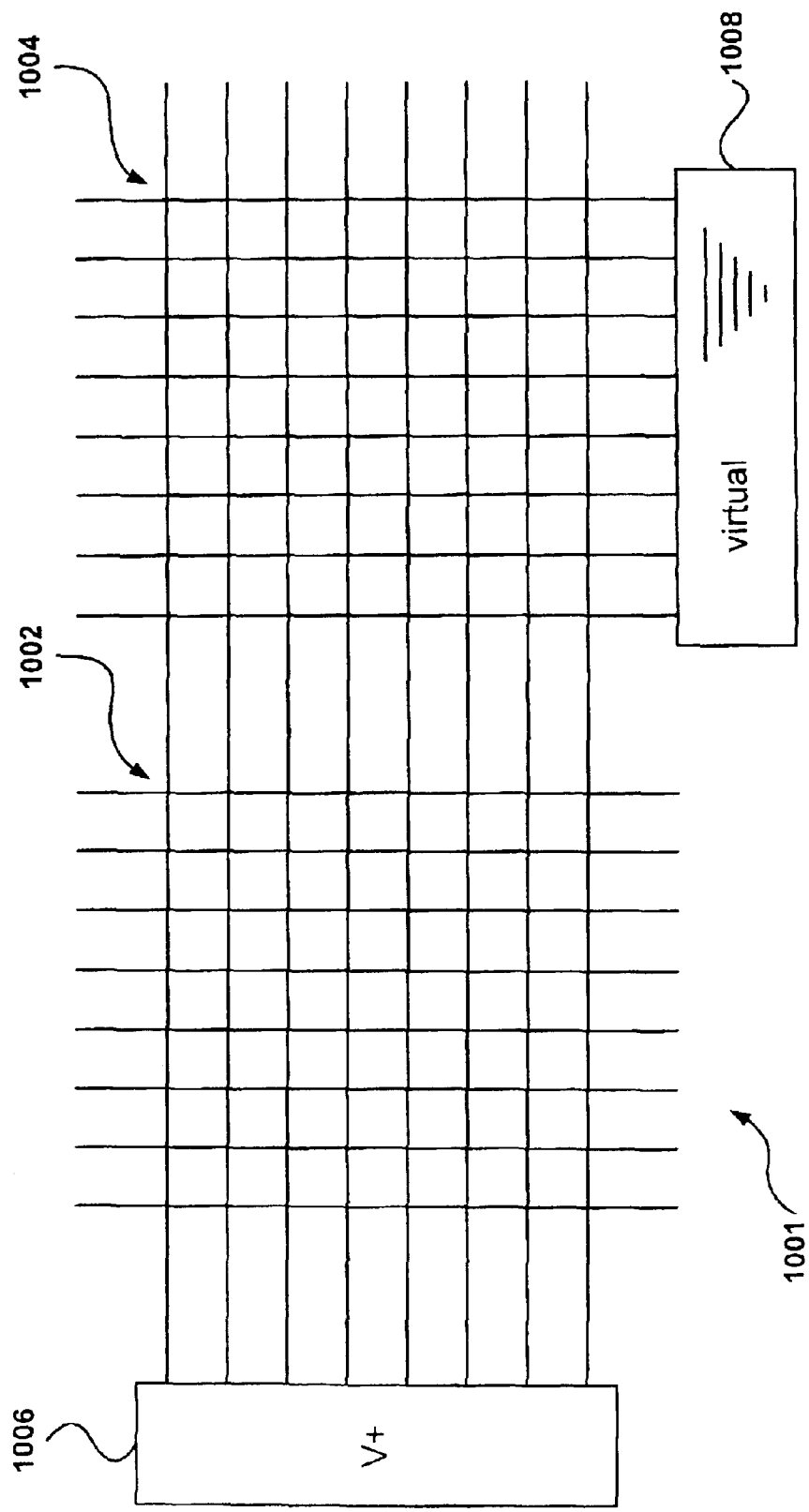
FIG. 10 shows a molecular-junction-nanowire crossbar comprising two microregions that is used for implementing the exemplary associative array shown in FIG. 9.

FIG. 10 shows a molecular-junction-nanowire crossbar comprising two microregions that is used for implementing the exemplary associative array shown in FIG. 9. The left-hand microregion 1002 of the molecular-junction-nanowire crossbar is chemically prepared to allow for selective configuration of nFET devices at lattice points. The right-hand microregion 1004 of the molecular-junction-nanowire crossbar 1001 is chemically prepared to allow for selective configuration of diode elements at lattice points. The horizontal nanowires of the molecular-junction-nanowire crossbar are connected to, and driven by, a relatively high-voltage current source 1006. The vertical nanowires of the right-hand microregion 1004 are interconnected with a virtual ground 1008. This virtual ground will be discussed, in greater detail, below. The molecular-junction-nanowire crossbar shown in FIG. 10 is the starting point for construction of the associative array shown in FIG. 9.

Figure 11:
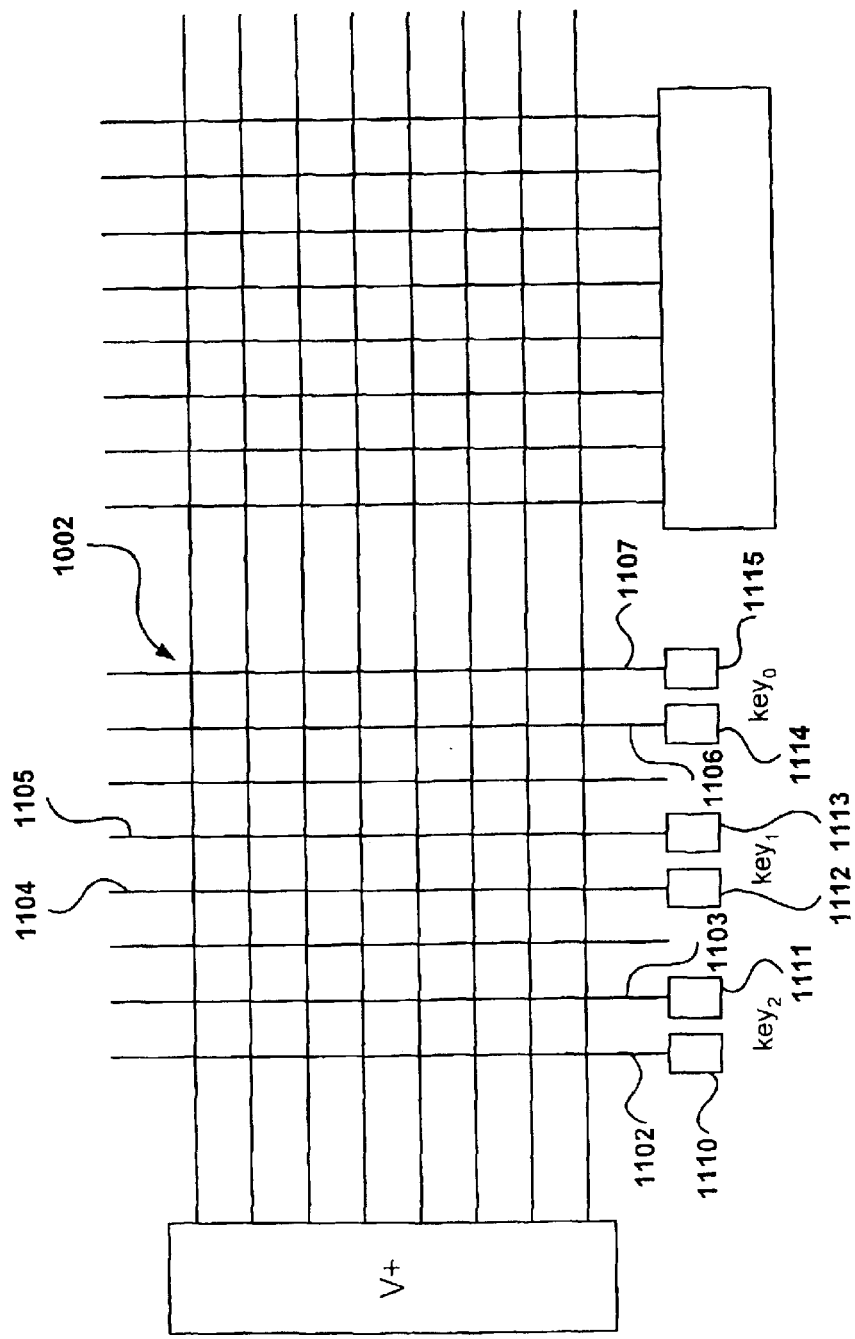
FIG. 11 illustrates a number of vertical nanowires, within the left-hand microregion of a molecular-junction-nanowire crossbar, selected as key molecular input signal lines.

First, as shown in FIG. 11, a number of vertical nanowires within the left-hand microregion 1002 are selected as key molecular input signal lines. As discussed above, each bit of a key is input via a pair of nanowire signal lines, the key line, and its complement. In FIG. 11, vertical nanowires 1102 and 1103 are selected as the pair corresponding to the high-order key-value bit "$key_2$." Similarly, the vertical nanowires 1104 and 1105 are selected as the key molecular signal-line pair representing the middle bit of a three-bit key, "$key_1$." Finally, vertical nanowires 1106 and 1107 are selected to represent the low-order key bit "$key_0$." Note that keys are input via a set of key registers 1110–1115. How keys are stored in these registers is beyond the scope of the present invention.

Figure 12:
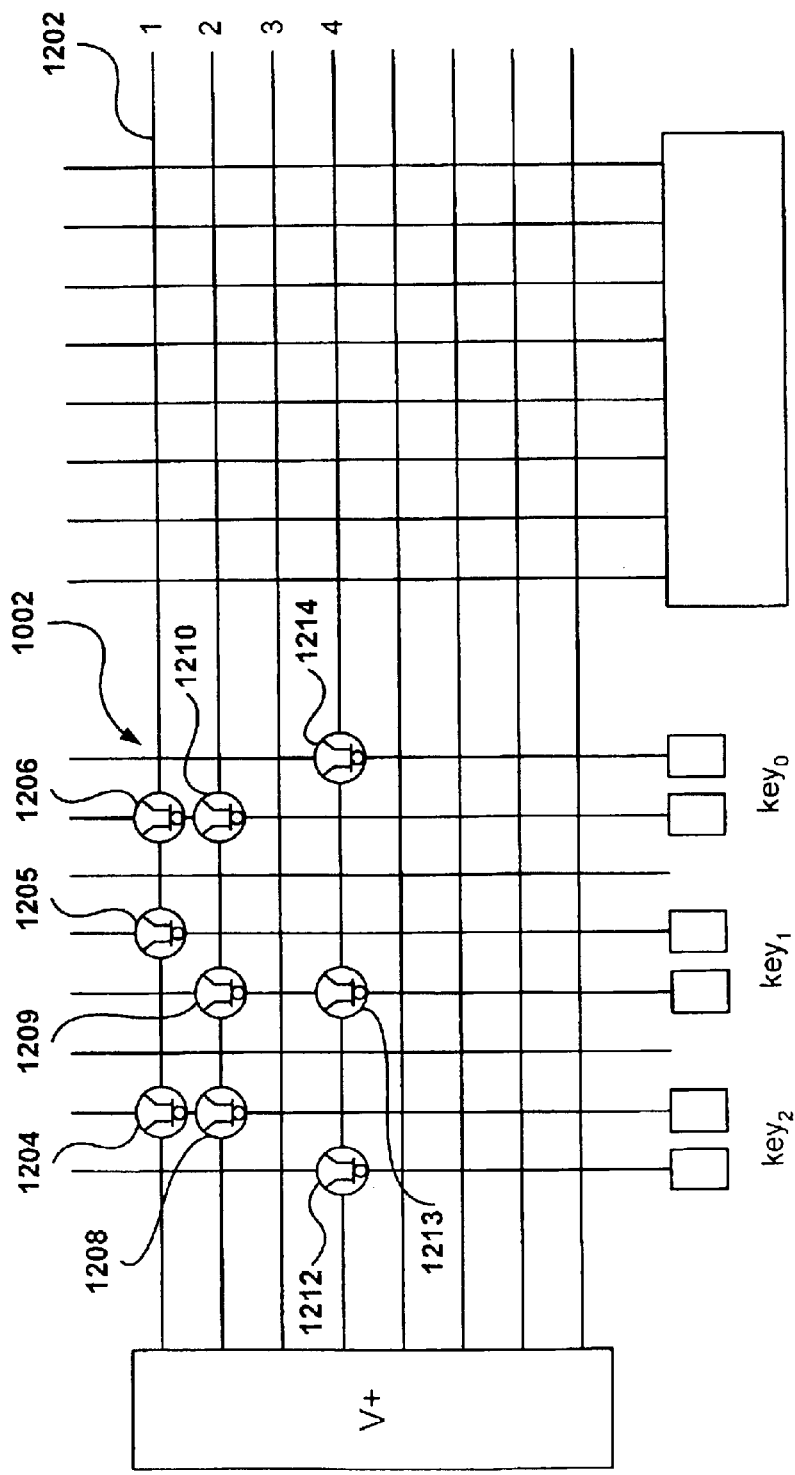
FIG. 12 shows encoding of keys into the molecular-junction-nanowire crossbar as selectively configured nFETs.

Next, the three keys "001," "011," and "110" are encoded into the molecular-junction-nanowire crossbar. FIG. 12 shows encoding of the keys into the molecular-junction-nanowire crossbar as selectively configured nFETs. As shown in FIG. 12, each of the top four horizontal nanowires corresponds to a key/value pair. The left-hand microregion 1002 encodes the keys of the key/value pairs. Consider they key "001" stored in the first row of the exemplary associative array shown in FIG. 9. That key is encoded along the top horizontal nanowire 1202 by three nFETs 1204–1206. Thus, nFETs 1204–1206 are positioned at the junctions of the vertical molecular-wire key-input nanowire signal lines that will be in an ON state when the key "001" is stored in the key registers (1110–1115 in FIG. 11). Similarly, nFETs 1208–1210 encode the key "011," the second key stored in the second row of the exemplary associative array shown in FIG. 9, and nFETs 1212–1214 encode the key "110" stored in the fourth row of the exemplary associative array shown in FIG. 9.

Figure 13:
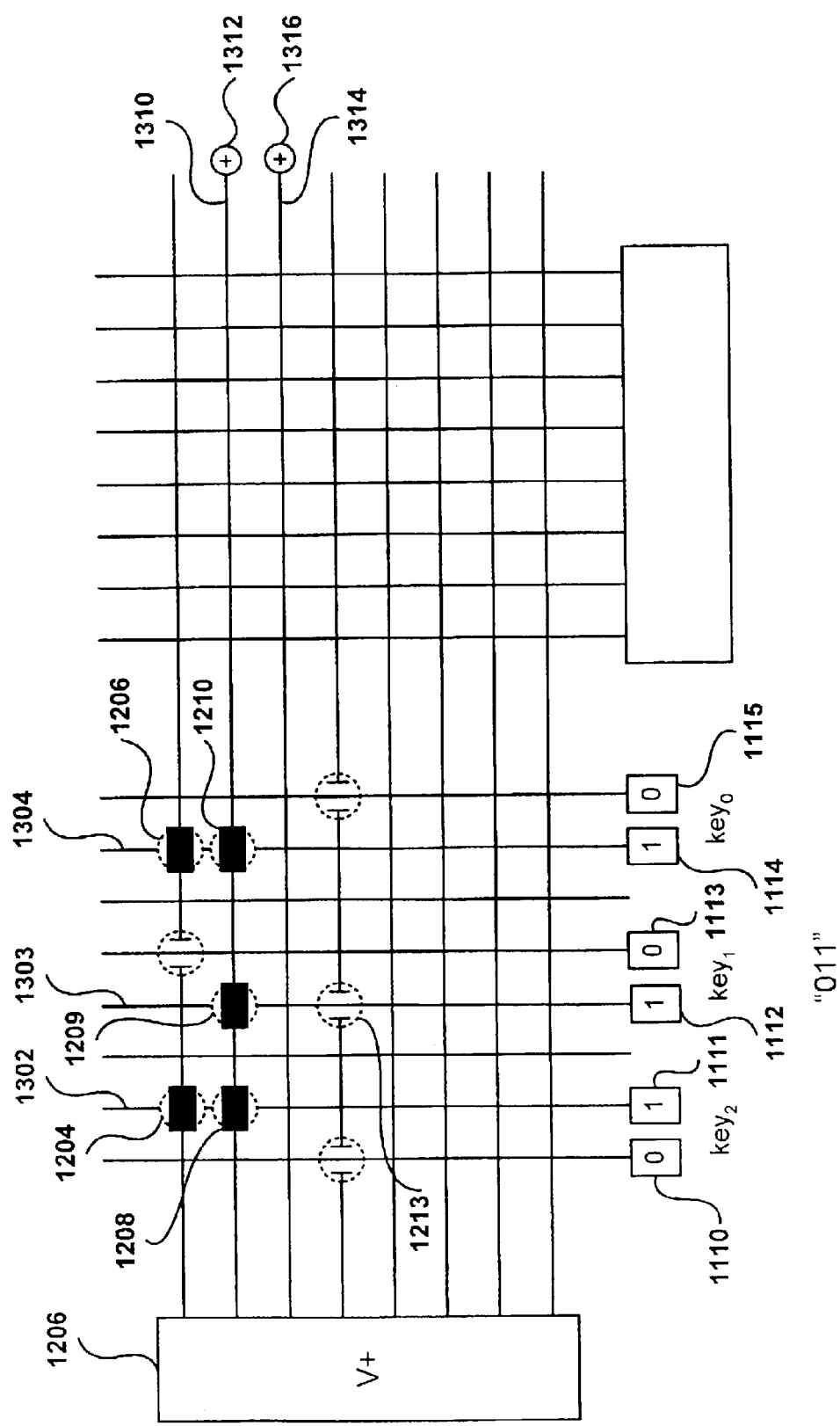
FIGS. 13 and 14 illustrate operation of the input of keys within the molecular-wire implementation of an associative-wire lattice.
Figure 14:
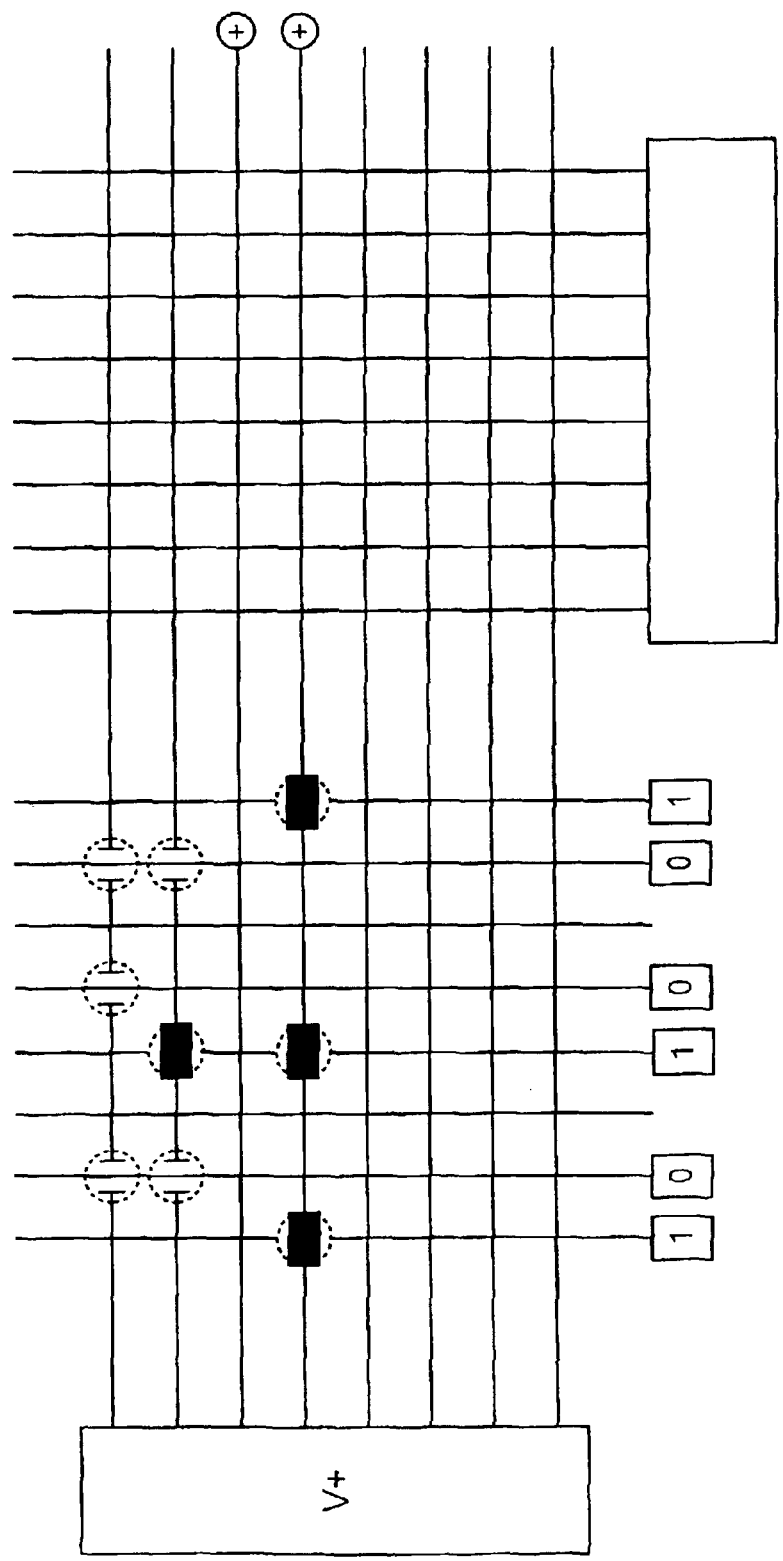

FIGS. 13 and 14 illustrate operation of the input of keys. In FIG. 13, the key "011" is stored in the key registers 1110–1115. Consider the high-order input key bit "$k_2$." This bit has the value 0, encoded by an OFF state in the left-hand key register 1110 and an ON state stored in the right-hand, complementary register 1111. Storing key "011" in the key registers 1110–1115 results in activation of vertical nanowires 1302–1304, and corresponding activation of the nFETs 1204, 1206, 1208–1210, and 1213 along with those vertical wires. When all nFETs on a particular horizontal nanowire are activated, via activation of the vertical, gating nanowires, then the horizontal nanowire can carry current from the high voltage power source 1206. As shown in FIG. 13, when the key "011" is input into the key registers 1110–1115, all three nFETs along the second horizontal vertical wire 1310 are activated, resulting in the horizontal nanowire 1310 transitioning to a relatively high voltage state via interconnection to a current source, indicated in FIG. 13 by the circled plus sign 1312. Note that the unused key/value slot (906 in FIG. 9) is represented by a horizontal nanowire without any nFETs within the right-hand microregion 1002. This horizontal wire corresponding to the unused key/value pair 1314 is also at a relatively high-voltage state, indicated in FIG. 13 by the circled plus sign 1316 to the right of the nanowire. Thus, a key input to the key registers has the effect of selecting a single horizontal nanowire corresponding to the input key, as well as any horizontal nanowires corresponding to unused entries in the associative array. Note that an invalid key, or key that does not match a key within the associative array, results in only horizontal nanowires corresponding to unused associative array entries having relatively high voltage states. FIG. 14 illustrates the activation of the fourth horizontal nanowire as the result of input of the key "110" to the key registers.

Figure 15:
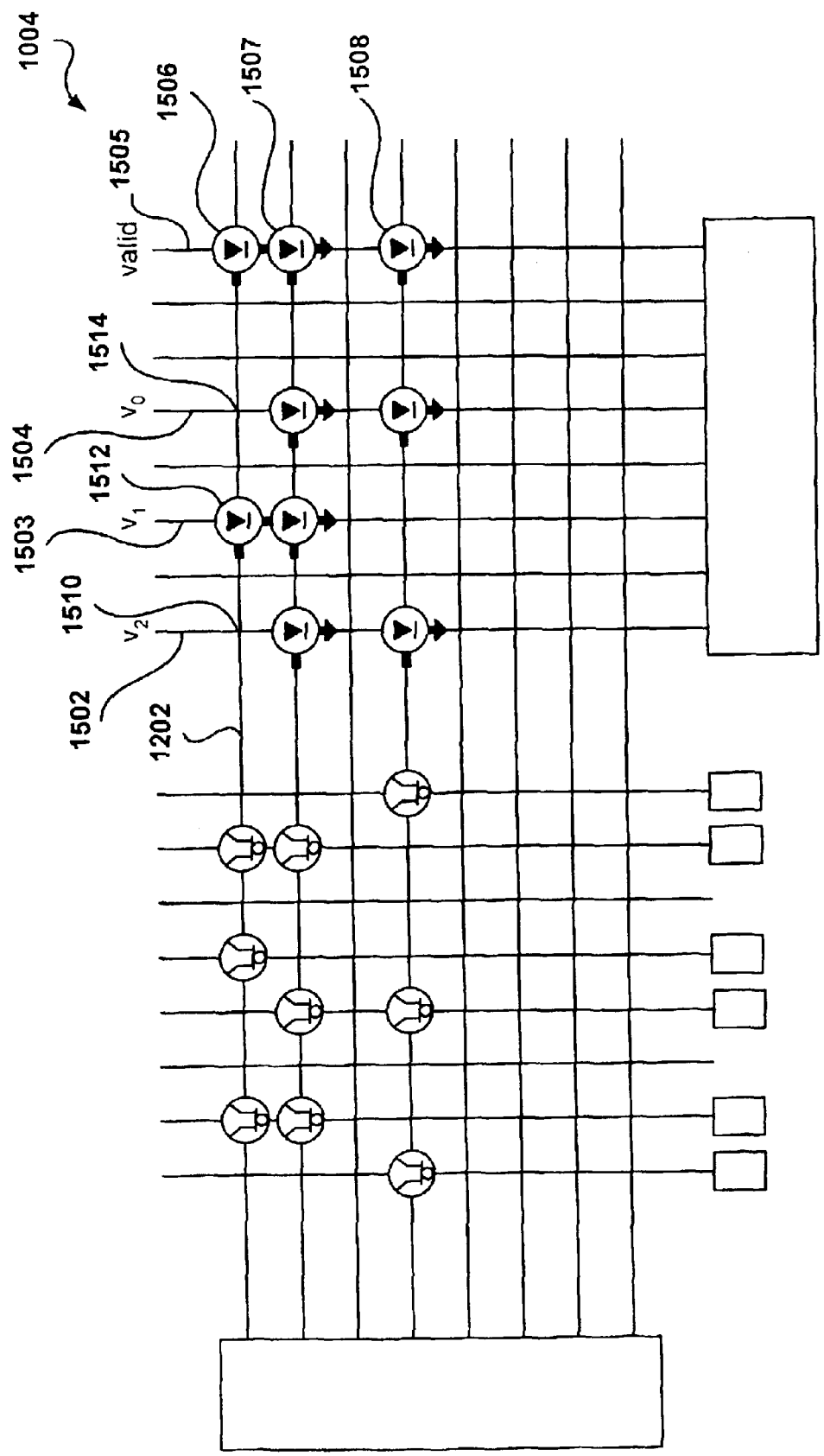
FIG. 15 shows diodes selectively configured in the right-hand microregion of the molecular-junction-nanowire crossbar in order to encode the values of key/value pairs shown in the exemplary associative array of FIG. 9.

Next, diodes are selectively configured in the right-hand microregion in order to direct current to value output nanowire signal lines and the valid-bit output nanowire signal line. FIG. 15 shows diodes selectively configured in the right-hand microregion of the molecular-junction-nanowire crossbar in order to encode the values of key/value pairs shown in the exemplary associative array of FIG. 9. First, three vertical nanowires 1502–1504 are selected to represent the high-order, middle, and low-order bits of the 3-bit output values, respectively. A fourth vertical nanowire 1505 is selected to output the valid bit, indicating whether or not an input key matches a key stored in a key/value pair within the associative array. Thus, each valid key/value-pair entry is encoded with a set of selectively configured nFETs representing key bits, and with diode elements representing value bits at the junctions between the horizontal nanowire encoding the key/value pair and the vertical nanowires 1502–1504 potentially interconnecting the horizontal nanowires with virtual ground 1008. Since the first, second and fourth entries of the associative array are valid key/value pairs, the selectively configured diodes 1506–1508 along the valid-bit vertical nanowire 1505 encode the fact that the first, second, and fourth key/value pairs are valid within the associative array. The values are encoded, in other words, in the right-hand microregion 1004, with the presence of a diode corresponding to a set bit "1" and the absence of a diode representing an unset bit "0." Thus, the value "010" in the first key/value-pair row of the exemplary associative array shown in FIG. 9 is encoded along horizontal nanowire 1202 by the absence of a diode at lattice point 1510, the presence of a diode at lattice point 1512, and the absence of a diode at lattice point 1514.

Figure 16:
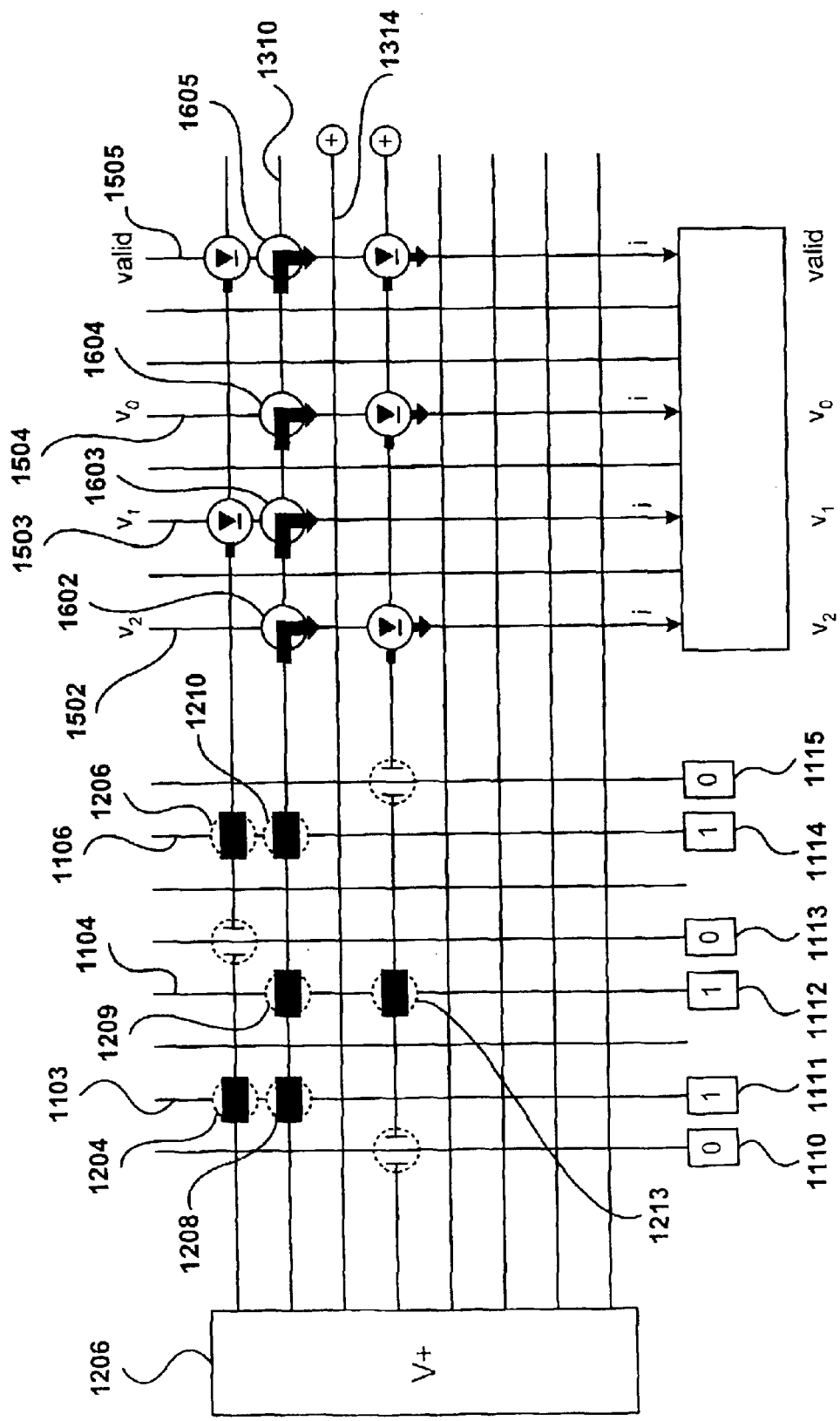
FIG. 16 illustrates operation of the associative array when the key "011" is input to the key registers.

The selective configuration of nFETs and diodes essentially completes implementation of the associative array. FIG. 16 illustrates operation of the associative array when the key "011" is input to the key registers 1110–1115. This input key raises the voltage of vertical nanowires 1103, 1104, and 1106, which in turn activate nFETs 1204, 1206, 1208–1210, and 1213. However, only horizontal nanowires 1310 and 1314 are fully interconnected with the high voltage power source 1206, since all nFETs 1208–1210 along horizontal nanowire 1310 are activated by the input key, and horizontal wire 1314, representing an unused key/value pair, has no nFETs. Because horizontal nanowire 1310 is connected to the high voltage power source 1206, current flows through the diodes at lattice points 1602–1605. Thus, current flows into all three value output nanowire signal lines 1502–1504 and to the valid-bit output nanowire signal line 1505. Current flowing in an output nanowire signal line indicates an ON, or "1" state, while the absence of current indicates an OFF, or "0" state. Input of key "011" to the key registers of the associative array selects the horizontal nanowire 1310, representing the second row of the associative array, and results in output of the value of the key/value pair stored in the second row of the associative array, "111."

Figure 17:
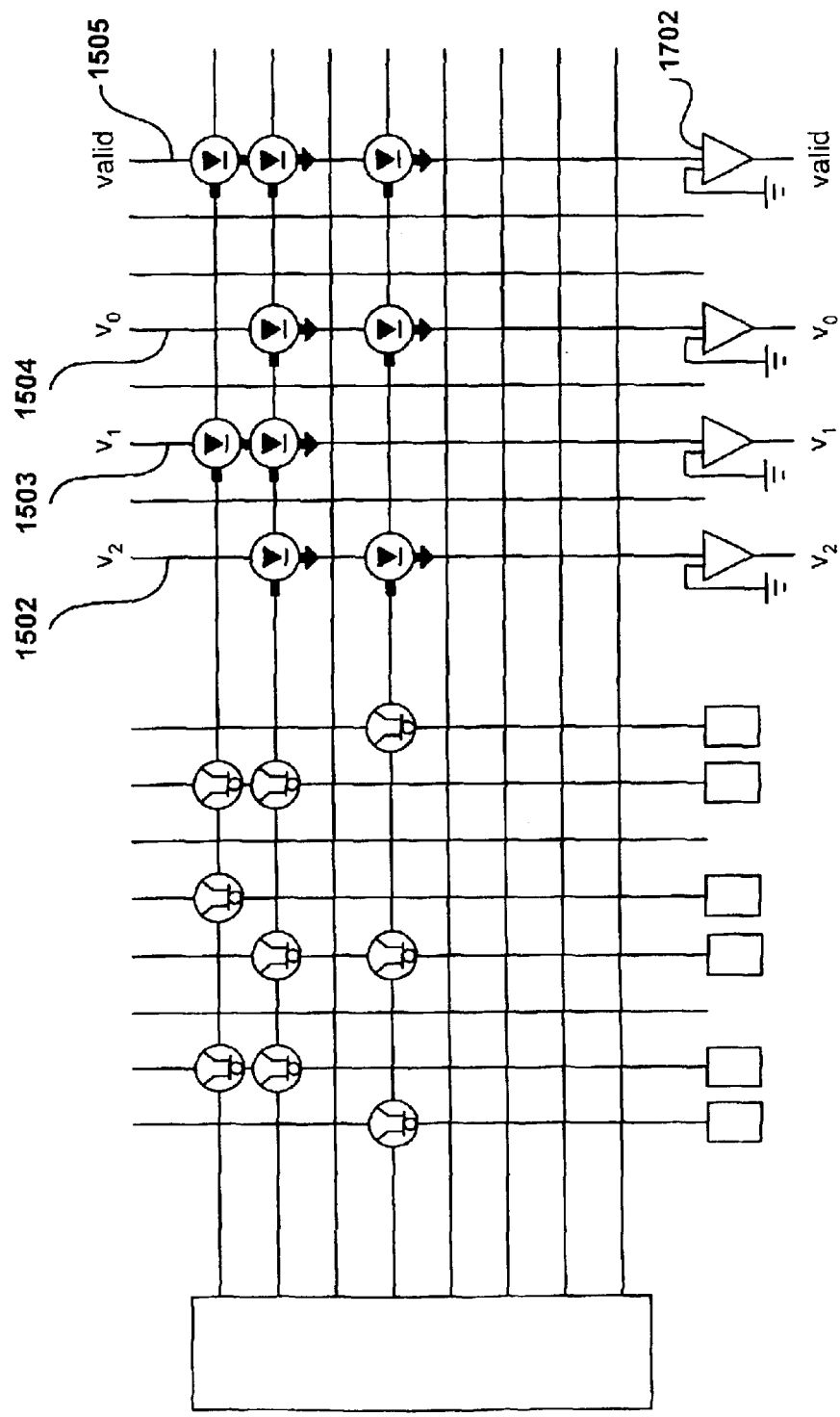
FIG. 17 illustrates one implementation of a current detection mechanism for detecting output values.

One detail remains, namely detection of current in the value and valid-bit output nanowire signal lines. FIG. 17 illustrates one implementation of a current detection mechanism for detecting output values. As shown in FIG. 17, each output nanowire signal line 1502–1505 is input to a sense amp, such as sense amp 1702, which amplifies the tiny current into a signal that can be propagated to other circuits that use the results of key matches carried out by the associative array.

In one embodiment, the output nanowire signal lines are configured as larger, microscale signal lines overlapped by the nanoscale horizontal nanowires representing key/value pairs. In such an implementation, many hundreds or thousands of key-value pairs may overlap the relatively small number of microscale output signal lines, which can then be directly interconnected with microscale circuitry within an integrated device. In general, lookup of keys via the associative array implemented within a molecular-junction-nanowire crossbar is quite fast, and largely independent of a number of key/value pairs stored in the associative array. Molecular-junction-nanowire crossbars are quite defect and fault tolerant, and can be configured using a variety of different topologies. Molecular-junction-nanowire crossbar implementations of circuits consume very little power, and have extremely high densities. These extremely dense circuits can then be combined into extremely dense subsystems that include many additional electrical components, implemented within a set of CS lattices. Thus, rather than simply representing a miniaturization of existing associative array circuits, in isolation, the present invention provides for building associative arrays into complex subsystems having transistor densities equal to, or greater than, 1 billion transistors/$cm^2$, or, in other words, having 1.0 giga-transistor/$cm^2$ densities and greater transistor densities.

Although the present invention has been described in terms of a particular embodiment, it is not intended that the invention be limited to this embodiment. Modifications within the spirit of the invention will be apparent to those skilled in the art. For example, an almost limitless number of different tilings and topologies can be employed to configure an almost limitless number of different associative arrays within a molecular-junction-nanowire crossbar. While the above-discussed implementation employs nFETs and diodes, associative arrays may be similarly constructed using pFETs and other simple, selectively configured lattice-point electrical components. For manufacturing efficiency and cost effectiveness, it is important that the chemical preparation of the transistor-containing and diode-containing microregions, including doping, be compatible, or identical, to avoid alignment problems and unnecessary multi-step procedures. Associative arrays of arbitrary size may be implemented using these techniques, for storing keys of arbitrary size and values of arbitrary size. Note also that, when reprogrammable nFETs, pFETs, and diodes are employed, an associative array may be repeatedly reconfigured to contain different, and different numbers of, key/value pairs.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A nanoscale associative array comprising:
   a set of key-input nanowire signal lines;
   a set of value-output nanowire signal lines; and
   a set of key/value-pair encodings that, when an input key matches a key of an encoded key/value pair, produce the value encoded with the key in a key/value pair on the set of value-output nanowire signal lines.

2. The nanoscale associative array of claim 1 wherein the key/value-pair encodings are programmable.

3. The nanoscale associative array of claim 1 implemented in a complementary/symmetry lattice additionally including other nanoscale components that, together with the nanoscale associative array, compose an electrical subsystem.

4. The electrical subsystem of claim 3 wherein the nanoscale components are configured together at densities within the electrical subsystem at densities greater than 1.0 giga-transistors/$cm^2$.

5. The nanoscale associative array of claim 1 further including a value-bit output nanowire signal line that indicates whether or not an input key matches a key of an encoded key/value pair.

6. The nanoscale associative array of claim 1 wherein the set of key/value-pair encodings comprises a first set of nanowires, each nanowire corresponding to a single key/value pair, layered over a second set and a third set of nanowires, the second set of nanowires potentially interconnecting the first set of nanowires with a relatively high voltage power source and the third set of nanowires potentially interconnecting the first set of nanowires with virtual ground.

7. The nanoscale associative array of claim 6 wherein the first set of nanowires is selectively interconnected with the second set of nanowires by selectively configured nFETs.

8. The nanoscale associative array of claim 6 wherein the first set of nanowires is selectively interconnected with the third set of nanowires by selectively configured diodes.

9. The nanoscale associative array of claim 6 wherein output values are detected by sense amps connected to the value-output nanowire signal lines.

10. The nanoscale associative array of claim 9 wherein microscale non-semiconductive signal lines are used in place of nanoscale non-semiconductive signal lines.

11. A method for configuring a nanoscale associative array, the method comprising:
providing a molecular-junction-nanowire crossbar;
selecting a set of key-input nanowire signal lines;
selecting a set of value-output nanowire signal lines; and
programming a set of key/value-pair encodings within the molecular-junction-nanowire crossbar that, when an input key matches a key of an encoded key/value pair, produce the value encoded with the key in a key/value pair on the set of value-output nanowire signal lines.

12. The method of claim 11 wherein the molecular-junction-nanowire crossbar is a complementary/symmetry lattice additionally including additional nanoscale components that, together with the nanoscale associative array, compose an electrical subsystem.

13. The method of claim 12 wherein the nanoscale components are configured together within the molecular-junction-nanowire crossbar at densities greater than 1.0 giga-transistors/$cm^2$.

14. The method of claim 11 further including selecting a value-bit output nanowire signal line that indicates whether or not an input key matches a key of an encoded key/value pair.

15. The method of claim 11 further including configuring the set of key/value-pair encodings between a first set of nanowires, each nanowire corresponding to a single key/value pair, and a second set and a third set of nanowires, the second set of nanowires potentially interconnecting the first set of nanowires with a relatively high voltage power source and the third set of nanowires potentially interconnecting the first set of nanowires with virtual ground.

16. The method of claim 15 further including selectively interconnecting the first set of nanowires with the second set of nanowires by selectively configuring nFETs at molecular-junction-nanowire crossbar points.

17. The method of claim 15 further including selectively interconnecting the first set of nanowires with the third set of nanowires by selectively configured diodes at molecular-junction-nanowire crossbar points.

18. The method of claim 11 further including, following initial configuration, programming a set of key/value-pair encodings into the molecular-junction-nanowire crossbar different from the set of key/value-pair encodings initially programmed within the molecular-junction-nanowire crossbar.

* * * * *